(12) United States Patent
Kim

(10) Patent No.: US 12,026,030 B2
(45) Date of Patent: Jul. 2, 2024

(54) BATTERY APPARATUS, BATTERY MANAGEMENT SYSTEM, AND METHOD FOR CORRECTING MEASURED VOLTAGE

(71) Applicant: LG Energy Solution, Ltd., Seoul (KR)

(72) Inventor: Dong Hyeon Kim, Daejeon (KR)

(73) Assignee: LG Energy Solution, Ltd., Seoul (KR)

(*) Notice: Subject to any disclaimer, the term of this patent is extended or adjusted under 35 U.S.C. 154(b) by 233 days.

(21) Appl. No.: 17/625,177

(22) PCT Filed: Jul. 1, 2021

(86) PCT No.: PCT/KR2021/008323
§ 371 (c)(1),
(2) Date: Jan. 6, 2022

(87) PCT Pub. No.: WO2022/019516
PCT Pub. Date: Jan. 27, 2022

(65) Prior Publication Data
US 2022/0365578 A1    Nov. 17, 2022

(30) Foreign Application Priority Data
Jul. 20, 2020   (KR) .................. 10-2020-0089445

(51) Int. Cl.
*G06F 1/30*       (2006.01)
*G01R 31/385*     (2019.01)
(Continued)

(52) U.S. Cl.
CPC ........... *G06F 1/305* (2013.01); *G01R 31/385* (2019.01); *H01M 10/425* (2013.01);
(Continued)

(58) Field of Classification Search
CPC .... G06F 1/305; G01R 31/385; H01M 10/425; H01M 2010/4271; H02J 7/0047; H02J 2207/10
See application file for complete search history.

(56) References Cited

U.S. PATENT DOCUMENTS 6,479,968 B1    11/2002  Pozsgay et al.
6,515,456 B1 *   2/2003  Mixon .............. H02J 7/007194
                                                        320/160
(Continued)

FOREIGN PATENT DOCUMENTS

CN    104104130 A    10/2014
CN    105467325 A     4/2016
(Continued)

OTHER PUBLICATIONS

International Search Report for Application No. PCT/KR2021/008323, dated Oct. 6, 2021, 2 pages.
(Continued)

*Primary Examiner* — Carlos Amaya
(74) *Attorney, Agent, or Firm* — Lerner David LLP

(57) ABSTRACT

A battery management system of a battery apparatus includes a circuit to which a voltage from a power supply is supplied and configured to be used to manage the battery pack. A processor of the battery management system controls the circuit, measure a voltage supplied from the power supply, and corrects the measured voltage based on a voltage drop occurred in the circuit.

18 Claims, 6 Drawing Sheets

(51) Int. Cl.
*H01M 10/42* (2006.01)
*H02J 7/00* (2006.01)
(52) U.S. Cl.
CPC ... *H02J 7/0047* (2013.01); *H01M 2010/4271* (2013.01); *H02J 2207/10* (2020.01)

(56) References Cited

U.S. PATENT DOCUMENTS

| | | |
|---|---|---|
| 8,949,056 B2 | 2/2015 | Yang et al. |
| 2004/0164709 A1* | 8/2004 | Kapsokavathis ..... H02J 7/0048 320/132 |
| 2009/0278508 A1* | 11/2009 | Sani ................. H02J 7/007182 320/162 |
| 2012/0032517 A1 | 2/2012 | Ido et al. |
| 2013/0057219 A1 | 3/2013 | Sakata |
| 2014/0306662 A1 | 10/2014 | Kim et al. |
| 2015/0258901 A1* | 9/2015 | Min ........................ B60L 50/51 320/137 |
| 2016/0241068 A1* | 8/2016 | Zhao .................... H02J 7/0071 |
| 2018/0053965 A1 | 2/2018 | Marcicki et al. |
| 2019/0084437 A1 | 3/2019 | Son et al. |
| 2019/0089019 A1 | 3/2019 | Lee et al. |
| 2019/0181658 A1 | 6/2019 | Kitagawa et al. |
| 2019/0310300 A1 | 10/2019 | Kawamura |
| 2020/0244079 A1* | 7/2020 | Meacham, II ...... H02J 7/00308 |

FOREIGN PATENT DOCUMENTS

| | | |
|---|---|---|
| CN | 205178581 U | 4/2016 |
| CN | 105699904 A | 6/2016 |
| CN | 207021751 U | 2/2018 |
| CN | 109541489 A | 3/2019 |
| CN | 109904905 A | 6/2019 |
| EP | 2228882 A2 | 9/2010 |
| JP | H1070846 A | 3/1998 |
| JP | 2004166370 A | 6/2004 |
| JP | 2010213499 A | 9/2010 |
| JP | 2012039778 A | 2/2012 |
| JP | 5789846 B2 | 10/2015 |
| JP | 2017009422 A | 1/2017 |
| JP | 2018148654 A | 9/2018 |
| JP | 2019184387 A | 10/2019 |
| KR | 2002-0024626 A | 4/2002 |
| KR | 100390362 B1 | 7/2003 |
| KR | 100471236 B1 | 3/2005 |
| KR | 101146404 B1 | 5/2012 |
| KR | 101551068 B1 | 9/2015 |
| KR | 2016-0028827 A | 3/2016 |
| KR | 101700805 B1 | 1/2017 |
| KR | 2018-0041908 A | 4/2018 |
| KR | 101856367 B1 | 5/2018 |
| KR | 20190032682 A | 3/2019 |

OTHER PUBLICATIONS

Extended European Search Report including Written Opinion for Application No. 21840767.4 dated Oct. 7, 2022, pp. 1-9.

* cited by examiner

BATTERY APPARATUS, BATTERY MANAGEMENT SYSTEM, AND METHOD FOR CORRECTING MEASURED VOLTAGE

CROSS-REFERENCE TO RELATED APPLICATIONS

The present application is a national phase entry under 35 U.S.C. § 371 of International Application No. PCT/2021/008323 filed Jul. 1, 2021, published in Korean, which claims priority from Korean Patent Application No. 10-2020-0089445 filed in the Korean Intellectual Property Office on Jul. 20, 2020, all of which are incorporated herein by reference.

TECHNICAL FIELD

The described technology relates to a battery apparatus, a battery management system, and a method for correcting measured voltage.

BACKGROUND ART

An electric vehicle or a hybrid vehicle is a vehicle that obtains power by driving a motor mainly using a battery as a power supply. The electric vehicles are being actively researched because they are alternatives that can solve pollution and energy problems of internal combustion vehicles. Rechargeable batteries are used in various external apparatuses other than the electric vehicles.

In addition to the battery for driving the motor, a battery is also used as a power supply for supplying a voltage (e.g., 12V) to various processors. The vehicle's processor communicates with other processors to check a status of a control device and instruct an operation by using such a power supply. Further, the vehicle's processor transmits an on/off command of a contactor such as a relay used in the battery, and a processor of a battery management system controls an on/off operation of the relay according to the command from the vehicle's processor.

An amount of current may increase according to the on/off operation of the relay. A voltage of the power supply measured by the processor of the battery management system may be different from a voltage of the power supply measured by the vehicle's processor due to a voltage drop caused by the current. Accordingly, even if the same logic is applied to both processors, a situation in which the same operation cannot be performed may occur.

SUMMARY

Technical Problem

Some embodiments may provide a battery apparatus, a battery management system, and a method for correcting a measured voltage, capable of correcting a voltage measured by a processor of the battery management system.

Technical Solution

According to an embodiment, a battery apparatus including a battery pack and a battery management system connected to the battery pack is provided. The battery management system may include a circuit configured to receive a voltage from a power supply and to manage the battery pack, and a processor configured to measure the voltage from the power supply and to correct the measured voltage based on a voltage drop in the circuit.

In some embodiments, the voltage drop may be at least in part across a wire connecting the power supply and the circuit.

In some embodiments, the circuit may include a diode having a cathode and an anode. The anode may be connected to a wire connecting the power supply and the circuit. The diode may be configured to transfer the voltage from the power supply to the circuit through the cathode. The voltage drop may be at least in part a forward voltage drop of the diode.

In some embodiments, the voltage drop may be at least in part a voltage drop across the wire.

In some embodiments, the processor may determine control of the circuit based on the corrected voltage.

In some embodiments, the processor may communicate with an external apparatus processor connected to the battery apparatus, and may receive a command from the external apparatus processor to control the circuit.

In some embodiments, the circuit may include a heating resistor configured to heat the battery pack, a first relay connected between a first terminal of the heating resistor and a positive terminal of the battery pack and configured to operate based on the voltage from the power supply, and a second relay connected between a second terminal of the heating resistor and a negative terminal of the battery pack and configured to operate based on the voltage from the power supply. The processor may be configured to control operations of the first relay and the second relay. The processor may be configured to correct the measured voltage based further on a correction value that varies depending on states of the first relay and the second relay.

In some embodiments, the correction value of a state in which the first relay and the second relay are closed may be greater than the correction value of a state in which only one of the first relay and the second relay is closed. The correction value of a state in which only one of the first relay and the second relay is closed may be greater than the correction value of a state in which the first relay and the second relay are open.

In some embodiments, the processor may correct the measured voltage by adding the correction value to the measured voltage.

In some embodiments, the first relay may include a first switch connected between the first terminal of the heating resistor and the positive terminal of the battery pack and a first relay coil configured to drive the first switch. The second relay may include a second switch connected between the second terminal of the heating resistor and the negative terminal of the battery pack and a second relay coil configured to drive the second switch. The circuit may further include a first driver connected to the first relay coil and a second driver connected to the second relay coil. The processor may control the first driver to supply the voltage from the power supply to the first relay coil, and control the second driver to supply the voltage from the power supply to the second relay coil.

According to another embodiment, a method of measuring and correcting a voltage of a power supply used in a circuit configured to manage a battery pack is provided. The method includes measuring, by a processor, the voltage of the power supply, determining, by the processor, a state of the circuit, determining, by the processor, a correction value based on the state of the circuit, and correcting, by the processor, the measured voltage based on the correction value.

In some embodiments, the method may further include determining, by the processor, control of the circuit based on the corrected voltage.

In some embodiments, determining the correction value may include determining the correction value based on a voltage drop in the circuit according to the state of the circuit.

In some embodiments, the state of the circuit may be based on states of a plurality of relays included in the circuit.

According to yet another embodiment, a battery management system connected to a battery pack is provided. The battery management system includes a circuit configured to receive a voltage from a power supply and to manage the battery pack, and a processor configured to control the circuit, measure the voltage from the power supply, and correct the measured voltage based on a voltage drop occurred in the circuit.

Advantageous Effects

According to an embodiment, even if a voltage drop occurs in a circuit of the battery management system according to a status of relays, a voltage measured by a processor may be corrected based on the voltage drop.

DETAILED DESCRIPTION

Figure 1:
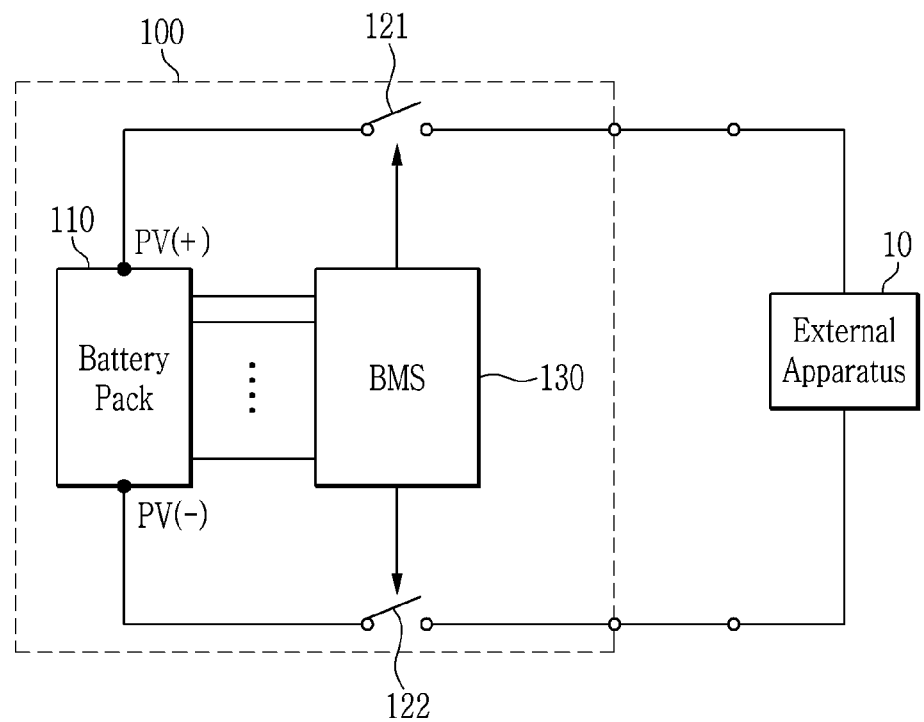
FIG. 1 is a drawing showing a battery apparatus according to an embodiment.

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is "connected" to another element, it should be understood that the element may be directly connected to the other element or connected to the other element through a third element. On the other hand, when it is described that an element is "directly connected" to another element, it should be understood that the element is connected to the other element through no third element.

As used herein, a singular form may be intended to include a plural form as well, unless the explicit expression such as "one" or "single" is used.

In flowcharts described with reference to the drawings, the order of operations or steps may be changed, several operations or steps may be merged, a certain operation or step may be divided, and a specific operation or step may not be performed.

FIG. 1 is a drawing showing a battery apparatus according to an embodiment.

Referring to FIG. 1, a battery apparatus 100 has a structure that can be electrically connected to an external apparatus 10 through a positive link terminal DC(+) and a negative link terminal DC(−). When the external apparatus is a load, the battery apparatus 100 is discharged by operating as a power supply that supplies power to the load. The external apparatus 10 operating as the load may be, for example, an electronic device, a mobility apparatus, or an energy storage system (ESS). The mobility apparatus may be, for example, a vehicle such as an electric vehicle, a hybrid vehicle, or a smart mobility.

The battery apparatus 100 includes a battery pack 110, switches 121 and 122, and a battery management system (BMS) 130.

The battery pack 110 includes a plurality of battery cells (not shown), and has a positive terminal PV(+) and a negative terminal PV(−). In some embodiments, the battery cell may be a rechargeable cell. In one embodiment, in the battery pack 110, a predetermined number of battery cells are connected in series to configure a battery module to supply desired power. In another embodiment, in the battery pack 110, a predetermined number of battery modules may be connected in series or in parallel to supply desired power.

The switch 121 is connected between the positive terminal PV(+) of the battery pack 110 and the positive link terminal DC(+) of the battery apparatus 100. The switch 122 is connected between the negative terminal PV(−) of the battery pack 110 and the negative link terminal DC(−) of the battery apparatus 100. The switches 121 and 122 may be controlled by a processor of the battery management system 130 to control an electrical connection between the battery pack 110 and the external apparatus 10. In some embodiments, each of the switches 121 and 122 may be a contactor formed of a relay. In some embodiments, the battery apparatus 100 may further include driving circuits (not shown) for controlling the switches 121 and 122, respectively.

The battery management system 130 may include various monitoring circuits (not shown) and the processor (not shown). Various monitoring circuits may monitor a voltage, a temperature, a current, and the like of the battery pack 110. The processor may determine a state of the battery pack 110 based on information monitored by various monitoring circuits. The processor may be, for example, a micro controller unit (MCU). The battery management system 130 may further include a heating device (not shown) for controlling the temperature of the battery pack 110, and the processor may control an operation of the heating device.

The battery apparatus 100 or the external apparatus 10 may further include a battery as a power supply that supplies a voltage for operating the battery management system 130. The power supply may also supply a voltage to the external apparatus 10, for example a processor in a vehicle. In this case, a voltage drop occurs in the battery management system 130 by an operation of a heating device so that an error may occur between the voltage of the power supply measured by the processor of the battery management system 130 and the voltage of the power supply measured by the processor of the vehicle. Hereinafter, embodiments for correcting such an error are described.

Figure 2:
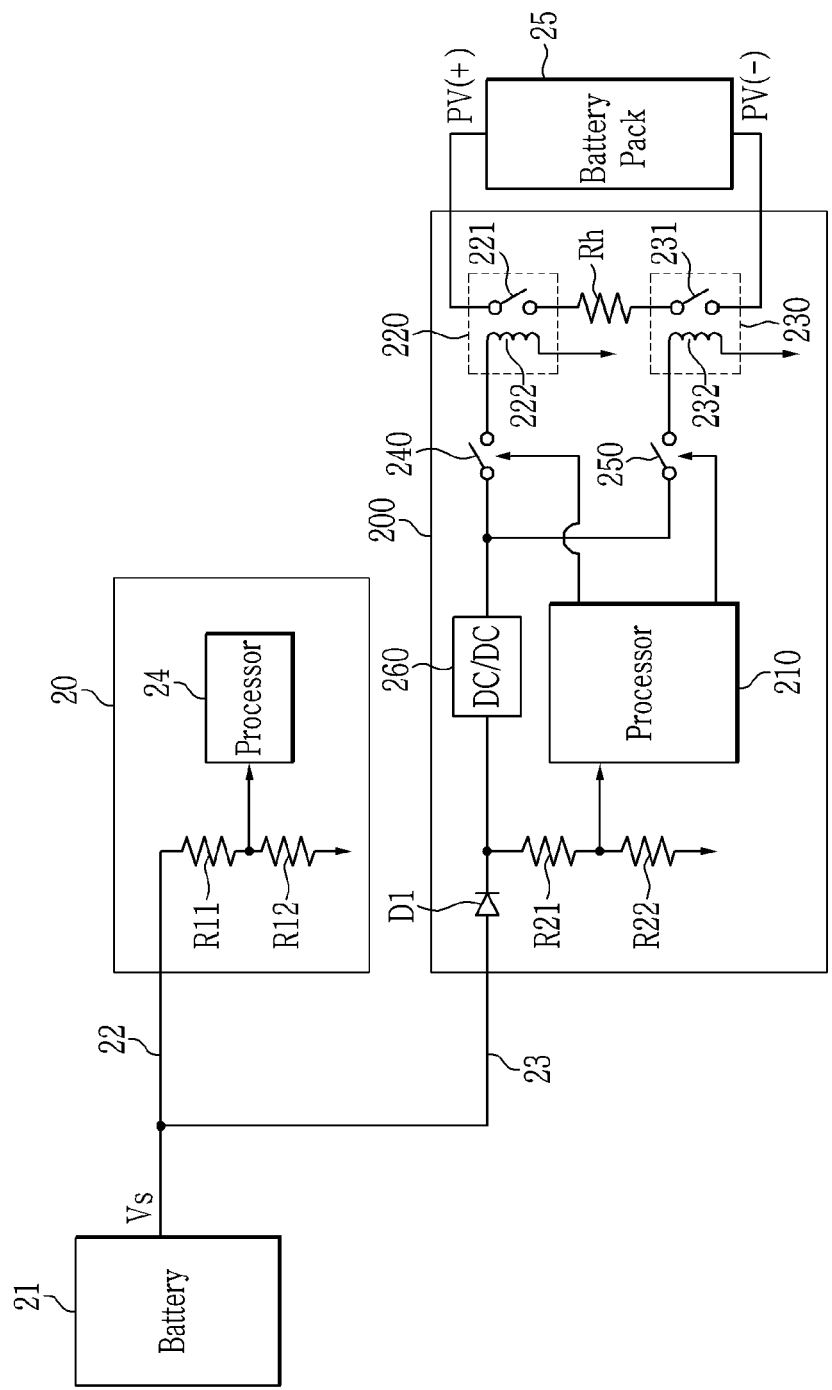
FIG. 2 is a diagram for explaining a battery management system according to an embodiment.

FIG. 2 is a diagram for explaining a battery management system according to an embodiment.

Referring to FIG. 2, a power supply supplies a voltage Vs to a processor 24 of an external apparatus 20, for example, a vehicle, through a wire 22, and supplies the voltage Vs to a battery management system 200 through a wire 23. In some embodiments, the power supply may include a battery. The battery 21 may supply, for example, a voltage of 12V. In some embodiments, the battery 21 may be a lead acid battery or a lithium ion battery.

The processor 24 of the vehicle communicates with other processors of the vehicle and issues commands for turning on/off various devices. Further, the processor 24 measures the voltage Vs supplied from the battery 21. To this end, the vehicle may further include a voltage sensing circuit. In some embodiments, the voltage sensing circuit may include two resistors R11 and R12 connected in series between the wire 22 and a ground terminal. The voltage Vs may be divided by the two resistors R11 and R12, and the divided voltage may be transferred to the processor 24. In one embodiment, the voltage sensing circuit may further include an analog-to-digital converter for converting the divided voltage into a digital signal. The processor 24 may check the voltage Vs of the battery 21 detected by the voltage detection circuit.

The battery management system 200 is connected to a battery pack 25, and includes a processor 210 and a management circuit used to manage the battery pack 25. The processor 210 measures the voltage Vs supplied from the battery 21. To this end, the management circuit may further include a voltage sensing circuit. In some embodiments, the voltage sensing circuit may include two resistors R21 and R22 connected in series between the wire 23 and the ground terminal. The voltage Vs may be divided by the two resistors R21 and R22, and the divided voltage may be transferred to the processor 210. In one embodiment, the voltage sensing circuit may further include an analog-to-digital converter for converting the divided voltage into a digital signal. The processor 210 may check the voltage Vs of the battery 21 detected by the voltage detection circuit.

In some embodiments, the processor 210 may communicate with the vehicle's processor 24 to transfer information of the battery pack 25. The information of the battery pack 25 may include a cell voltage of the battery pack 25 and a temperature of the battery pack 25. The processor 24 of the vehicle may send a command to the processor 210 based on the information of the battery pack 25. In one embodiment, a controller area network (CAN) communication may be used for communication between the processor 210 and the processor 24.

In some embodiments, the management circuit may include a heating device. The heating device is a device for heating the battery pack 25, and includes a heating resistor Rh, relays 220 and 230, and drivers 240 and 250. The heating resistor Rh generates heat when current flows to heat the battery pack 25, thereby increasing the temperature. The relay 220 includes a relay switch 221 and a relay coil 222 for driving the relay switch 221, and the relay 230 includes a relay switch 231 and a relay coil 232 for driving the relay switch 231. The relay switch 221 is connected between a positive terminal PV(+) of the battery pack 25 and a first terminal of the heating resistor Rh, and the relay switch 231 is connected between a negative terminal of the battery pack 25 and a second terminal of the heating resistor Rh. When the relay switches 221 and 231 are turned on, current flows from the battery pack 25 to the heating resistor Rh so that the battery pack 25 can be heated. A first terminal of the driver 240 receives the voltage Vs from the wire 23, the second terminal of the driver 240 is connected to a first terminal of the relay coil 222, and a second terminal of the relay coil 222 is connected to the ground terminal. A first terminal of the driver 250 receives the voltage Vs from the wire 23, a second terminal of the driver 250 is connected to a first terminal of the relay coil 232, and a second terminal of the relay coil 232 is connected to the ground terminal.

The drivers 240 and 250 transfers the voltage Vs from the wire 23 to the relay coils 222 and 232 in response to enable signals from the processor 210, respectively. Accordingly, current flows in the relay coils 222 and 232 so that the relay switches 221 and 231 can be turned on by the relay coils 222 and 232, respectively. Each of the drivers 240 and 250 may include a switch that is turned on in response to the enable signal from the processor 210. In some embodiments, the processor 24 of the vehicle may receive the temperature of the battery pack 25 from the processor 210 and transfer to the processor 210 a command to close the relays 220 and 230 when the temperature of the battery pack 25 is lower than a reference temperature. The processor 210 may transfer the enable signals to the drivers 240 and 250 in response to the command from the processor 24. Closing the relay may be referred to as ON of the relay, and opening the relay may be referred to as OFF of the relay.

In some embodiments, one of the relays 220 and 230 may be removed. For example, when the relay 230 is removed, the second terminal of the heating resistor Rh is connected to the ground terminal, and the current flowing through the heating resistor Rh may be controlled by the relay 220.

In some embodiments, the battery management system 200 may further include a diode D1 to protect the battery 21 from a reverse voltage to be generated by the relay coils 222 and 232. In this case, an anode of the diode D1 may be connected to the wire 23, and the voltage Vs may be transferred to the relays 220 and 230 through a cathode of the diode D1.

In some embodiments, a DC/DC converter 260 may be further included to supply the fixed voltage Vs to the relay coils 222 and 232. An input terminal of the DC/DC converter 260 may be connected to the cathode of the diode D1, and the fixed voltage Vs may be transferred to the relays 220 and 230 through an output terminal of the DC/DC converter 260.

In this case, an error may occur between the voltage of the battery 21 measured by the processor 24 of the vehicle and the voltage of the battery 21 measured by the processor 210 of the battery management system 200. For example, when the voltage Vs of the battery 21 is measured to be a normal voltage of 12V as a result of measuring the voltage Vs of the battery 21 by the processor 24 of the vehicle, the processor 24 may transfer to the processor 210 of the battery management system 200 a command to close the relays 220 and 230. Accordingly, the processor 210 may measure the voltage of the battery 21 and then output a signal to close the relay 220 if the measurement result is 12V. After outputting the signal to close the relay 220 and before outputting the signal to close the relay 230, the processor 210 may measure the voltage of the battery 21 again. In this case, the driver 240 is turned on to close the relay 220 so that the current flowing in the relay coil 222 may increase. Because of a voltage drop across the wire 23 and an increase in a forward voltage of the diode D1 by the current flowing in the relay coil 222, the voltage Vs of the battery 21 measured by the processor 210 may be 10V lower than 12V. Then, the processor 210 may determine that it is difficult to supply sufficient power to close the relay 230 with 10V and then not close the relay 230.

In this way, although the processor 24 of the vehicle may accurately measure the voltage of the battery 21 because the voltage drop hardly occurs in the wire 22, the voltage of the battery 21 measured by the processor 210 of the battery management system 200 may be lower than the actual voltage because of the voltage drop across in the wire 23 and the forward voltage of the diode D1. As a result, the error may occur between the voltage measurements of the battery 21 by the two processors 24 and 210. In this case, since the two processors 24 and 210 use the same control logic, they may perform different operations according to different voltage measurements. Hereinafter, embodiments for correcting the voltage measurement error are described.

Figure 3:
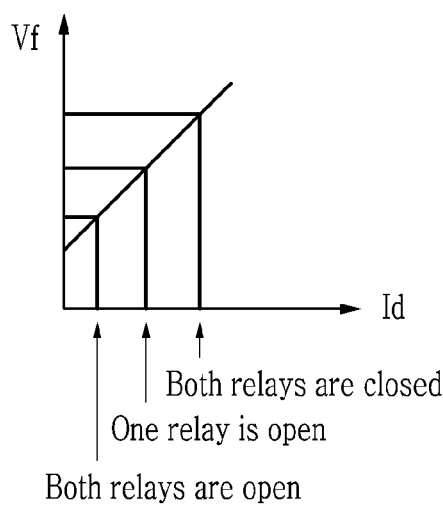
FIG. 3 is a diagram showing a forward voltage of a diode according to a status of a relay.
Figure 4:
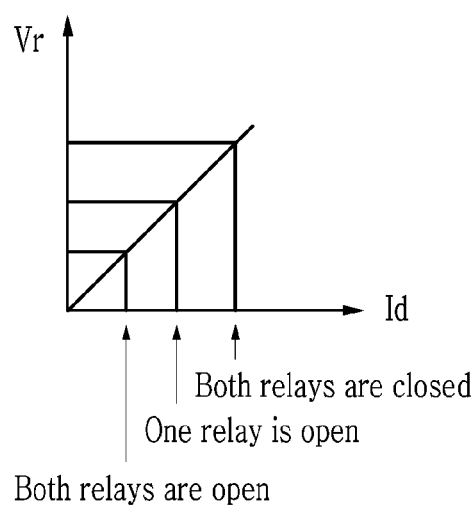
FIG. 4 is a diagram showing a voltage drop across a wire according to a status of a relay.

FIG. 3 is a diagram showing a forward voltage of a diode according to a status of a relay, and FIG. 4 is a diagram showing a voltage drop across a wire according to a status of a relay.

Referring to FIG. 3, the smallest current Id flows through a diode (D1 in FIG. 2) when both relays (220 and 230 in FIG. 2) are open, and the greatest current Id flows through the diode D1 when both the relays 220 and 230 are closed. The current Id flowing when one of the two relays 220 and 230 is open and the other is closed is greater than the current Id flowing when both the relays 220 and 230 are open, and is less than the current Id flowing when both the relays 220 and 230 are closed. As the current Id increases, a forward voltage drop Vf of the diode D1 also increases. Accordingly, the forward voltage drop Vf is also the smallest when both the relays 220 and 230 are open, and is the greatest when both the relays 220 and 230 are closed.

Referring to FIG. 4, the smallest current Id flows in the wire (23 in FIG. 2) when both relays (220 and 230 in FIG. 2) are open, and the greatest current Id flows in the wire 23 when both the relays 220 and 230 are closed. The current Id flowing when one of the two relays 220 and 230 is open and the other is closed is greater than the current Id flowing when both the relays 220 and 230 are open, and is less than the current Id flowing when both the relays 220 and 230 are closed. As the current Id increases, a voltage drop Vr across the wire 23 due to a resistance of the wire 23 also increases. As a result, the voltage drop Vr is also the smallest when both the relays 220 and 230 are open, and is the greatest when both the relays 220 and 230 are closed. Depending on the circuit used in the battery management system, the current Id may be zero when both the relays 220 and 230 are open. In this case, the forward voltage drop Vr may also be zero.

Next, a method for correcting a measured voltage according to various embodiments is described with reference to FIG. 5 to FIG. 7.

Figure 5:
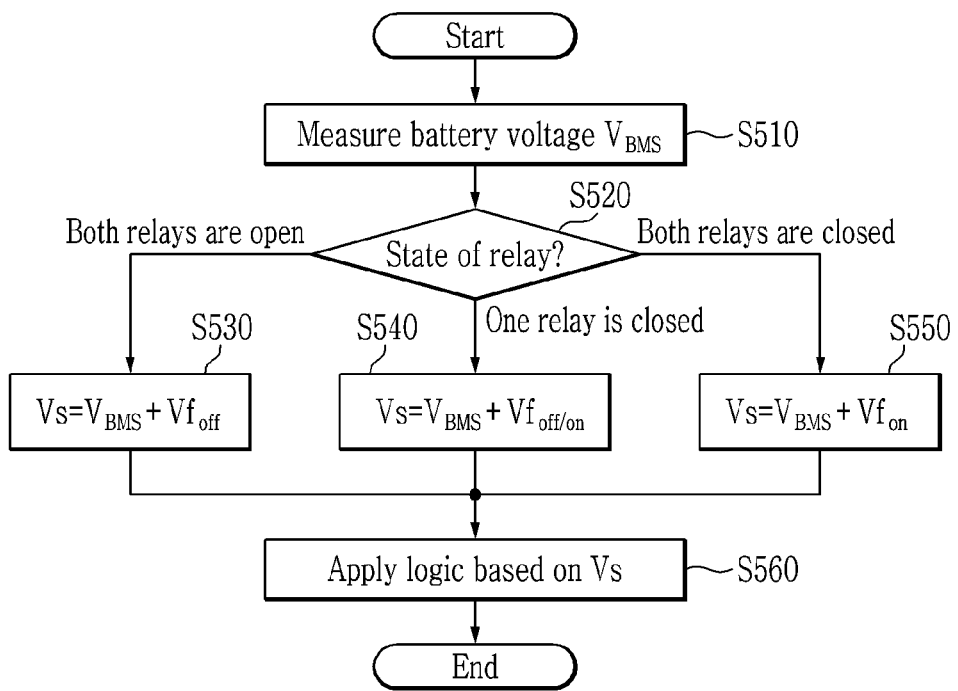
FIG. 5 is a flowchart showing a method for correcting a measured voltage according to an embodiment.

FIG. 5 is a flowchart showing a method for correcting a measured voltage according to an embodiment.

Referring to FIG. 5, a processor (210 in FIG. 2) of a battery management system measures a voltage of a battery (21 in FIG. 2) at S510. Further, the processor 210 checks current states of relays (220 or 230 in FIG. 2) at S520. Steps S510 and S520 may be performed simultaneously, or either one of the two steps may be performed first.

When both the relays 220 and 230 are open, the processor 210 corrects the measured battery voltage $V_{BMS}$ based on a forward voltage drop of a diode (D1 in FIG. 2) in a state in which both the relays 220 and 230 are open, and outputs the corrected battery voltage Vs at S530. In some embodiments, at S530, the processor 210 may correct the measured battery voltage $V_{BMS}$ by adding to the measured battery voltage $V_{BMS}$ a correction value $Vf_{off}$ according to the forward voltage drop of the diode D1 in a state in which both the relays 220 and 230 are open.

When one of the relays 220 and 230 is open and the other is closed, the processor 210 corrects the measured battery voltage $V_{BMS}$ based on a forward voltage drop of the diode D1 in a state in which one of the relays 220 and 230 are open, and outputs the corrected battery voltage Vs at S540. In some embodiments, at S540, the processor 210 may correct the measured battery voltage $V_{BMS}$ by adding to the measured battery voltage $V_{BMS}$ a correction value $Vf_{off/on}$ according to the forward voltage drop of the diode D1 in a state in which one of the relays 220 and 230 are open.

When both the relays 220 and 230 are closed, the processor 210 corrects the measured battery voltage $V_{BMS}$ based on a forward voltage drop of the diode D1 in a state in which both the relays 220 and 230 are closed, and outputs the corrected battery voltage Vs at S550. In some embodiments, at S550, the processor 210 may correct the measured battery voltage $V_{BMS}$ by adding to the measured battery voltage $V_{BMS}$ a correction value $Vf_{on}$ according to the forward voltage drop of the diode D1 in a state in which both the relays 220 and 230 are closed.

The corrected battery voltage Vs calculated at steps S530, S540, and S550 may be expressed as in below Equation 1.

$$Vs = \begin{cases} V_{BMS} + Vf_{off} & \text{if two relays are open} \\ V_{BMS} + Vf_{off/on} & \text{if one relay is open} \\ V_{BMS} + Vf_{on} & \text{if two relays are closed} \end{cases} \quad \text{Equation 1}$$

In some embodiments, at S560, the processor 210 may apply logic according to a command from a processor of a vehicle based on the corrected battery voltage Vs. In one embodiment, the processor 210 may determine whether to control the relays 220 and 230 based on the corrected battery voltage Vs at S560.

In some embodiments, when a product of the relay 220 is different from a product of the relay 230, the correction value according to the forward voltage drop of the diode D1 in a state in which the relay 220 is opened and the relay 230 is closed may be different from the correction value according to the forward voltage drop of the diode D1 in a state in which the relay 220 is closed and the relay 230 is opened.

In some embodiments, the correction value according to the forward voltage drop of the diode D1 based on the states of the relays may be calculated after measuring the forward voltage of the diode D1 according to the states of the relays as shown in FIG. 3. In one embodiment, the correction value according to the forward voltage drop of the diode D1 may have been stored in the processor 210 or a storage device accessible by the processor 210.

According to the above-described embodiments, even if the forward voltage drop of the diode D1 occurs according to the states of the relays 220 and 230, the voltage of the battery 21 measured by the processor 210 can be corrected based on the forward voltage drop of the diode D1 so that the error between the voltages measured by the two processors 24 and 210 can be reduced. Accordingly, it is possible to prevent the two processors 24 and 210 to which the same logic is applied from performing different operations.

Figure 6:
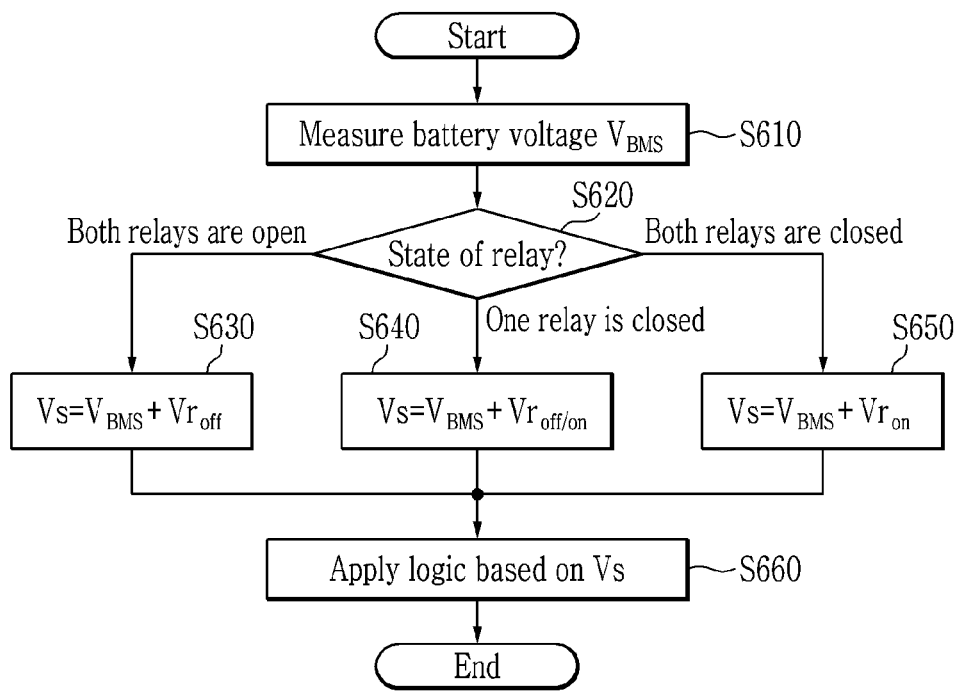
FIG. 6 is a flowchart showing a method of correcting a measured voltage according to another embodiment.

FIG. 6 is a flowchart showing a method of correcting a measured voltage according to another embodiment.

Referring to FIG. 6, a processor (210 in FIG. 2) of a battery management system measures a voltage of a battery (21 in FIG. 2) at S610. Further, the processor 210 checks current states of relays (220 and 230 in FIG. 2) at S620. Steps S610 and S620 may be performed simultaneously, or either one of the two steps may be performed first.

When both the relays 220 and 230 are open, the processor 210 corrects the measures battery voltage $V_{BMS}$ based on a voltage drop across a wire (23 in FIG. 2) in a state in which both the relays 220 and 230 are open, and outputs the corrected battery voltage Vs at S630. In some embodiments, at S630, the processor 210 may correct the measured battery voltage $V_{BMS}$ by adding to the measured battery voltage $V_{BMS}$ a correction value $Vr_{off}$ according to the voltage drop across the wire 23 in a state in which both the relays 220 and 230 are open.

When one of the relays 220 and 230 is open and the other is closed, the processor 210 corrects the measures battery voltage $V_{BMS}$ based on a voltage drop across the wire 23 in a state in which one of the relays 220 and 230 are open, and outputs the corrected battery voltage Vs at S640. In some embodiments, at S640, the processor 210 may correct the measured battery voltage $V_{BMS}$ by adding to the measured battery voltage $V_{BMS}$ a correction value $Vr_{off/on}$ according to the voltage drop across the wire 23 in a state in which one of the relays 220 and 230 are open.

When both the relays 220 and 230 are closed, the processor 210 corrects the measured battery voltage $V_{BMS}$ based on a voltage drop across the wire 23 in a state in which both the relays 220 and 230 are closed, and outputs the corrected battery voltage Vs at S650. In some embodiments, at S650, the processor 210 may correct the measured battery voltage $V_{BMS}$ by adding to the measured battery voltage $V_{BMS}$ a correction value $Vr_{on}$ according to the voltage drop across the wire 23 in a state in which both the relays 220 and 230 are closed.

The corrected battery voltage Vs calculated in steps S630, S640 and S650 may be expressed as in below Equation 2.

$$Vs = \begin{cases} V_{BMS} + Vr_{off} & \text{if two relays are open} \\ V_{BMS} + Vr_{off/on} & \text{if one relay is open} \\ V_{BMS} + Vr_{on} & \text{if two relays are closed} \end{cases} \quad \text{Equation 2}$$

In some embodiments, at S660, the processor 210 may apply logic according to a command from a processor of a vehicle based on the corrected battery voltage Vs. In one embodiment, the processor 210 may determine whether to control the relays 220 and 230 based on the corrected battery voltage Vs at S660.

In some embodiments, when a product of the relay 220 is different from a product of the relay 230, the correction value according to the voltage drop across the wire 23 in a state in which the relay 220 is opened and the relay 230 is closed may be different from the correction value according to the voltage drop across the wire 23 in a state in which the relay 220 is closed and the relay 230 is opened.

In some embodiments, the correction value according to the voltage drop across the wire 23 based on the states of the relays may be calculated after measuring the voltage drop across the wire 23 according to the states of the relays as shown in FIG. 4. In one embodiment, the correction value according to the voltage drop across the wire 23 may have been stored in the processor 210 or a storage device accessible by the processor 210.

According to the above-described embodiments, even if the voltage drop across the wire 23 occurs according to the states of the relays 220 and 230, the voltage of the battery 21 measured by the processor 210 can be corrected based on the voltage drop across the wire 23 so that the error between the voltages measured by the two processors 24 and 210 can be reduced. Accordingly, it is possible to prevent the two processors 24 and 210 to which the same logic is applied from performing different operations.

Figure 7:
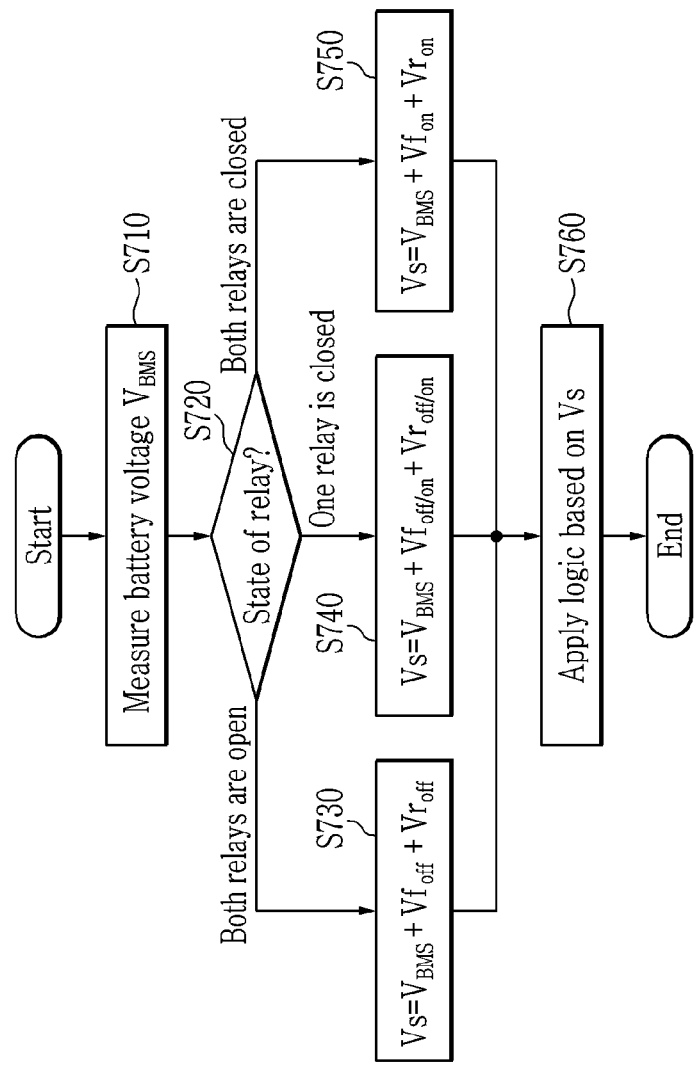
FIG. 7 is a flowchart showing a method of correcting a measured voltage according to yet another embodiment.

FIG. 7 is a flowchart showing a method of correcting a measured voltage according to yet another embodiment.

Referring to FIG. 6, a processor (210 in FIG. 2) of a battery management system measures a voltage of a battery (21 in FIG. 2) at S710. Further, the processor 210 checks current states of relays (220 and 230 in FIG. 2) at S720. Steps S710 and S720 may be performed simultaneously, or either one of the two steps may be performed first.

When both the relays 220 and 230 are open, the processor 210 corrects the measures battery voltage $V_{BMS}$ based on a forward voltage drop of a diode (D1 in FIG. 2) and a voltage drop across a wire (23 in FIG. 2) in a state in which both the relays 220 and 230 are open, and outputs the corrected battery voltage Vs at S730. In some embodiments, at S730, the processor 210 may correct the measured battery voltage $V_{BMS}$ by adding to the measured battery voltage $V_{BMS}$ a correction value $Vf_{off}$ according to the forward voltage drop of the diode D1 and a correction value $Vr_{on}$ according to the voltage drop across the wire 23 in a state in which both the relays 220 and 230 are open.

When one of the relays 220 and 230 is open and the other is closed, the processor 210 corrects the measures battery voltage $V_{BMS}$ based on a forward voltage drop of the diode D1 and a voltage drop across the wire 23 in a state in which one of the relays 220 and 230 are open, and outputs the corrected battery voltage Vs at S740. In some embodiments, at S740, the processor 210 may correct the measured battery voltage $V_{BMS}$ by adding to the measured battery voltage $V_{BMS}$ a correction value $Vf_{off/on}$ according to the forward voltage drop of the diode D1 and a correction value $Vr_{off/on}$ according to the voltage drop across the wire 23 in a state in which one of the relays 220 and 230 are open.

When both the relays 220 and 230 are closed, the processor 210 corrects the measured battery voltage $V_{BMS}$ based on a forward voltage drop of the diode D1 and a voltage drop across the wire 23 in a state in which both the relays 220 and 230 are closed, and outputs the corrected battery voltage Vs at S750. In some embodiments, at S750, the processor 210 may correct the measured battery voltage $V_{BMS}$ by adding to the measured battery voltage $V_{BMS}$ a correction value $Vf_{on}$ according to the forward voltage drop of the diode D1 and a correction value $Vr_{on}$ according to the voltage drop across the wire 23 in a state in which both the relays 220 and 230 are closed.

The corrected battery voltage Vs calculated in steps S730, S740 and S750 may be expressed as in below Equation 3.

$$Vs = \begin{cases} V_{BMS} + Vf_{off} + Vr_{off} & \text{if two relays are open} \\ V_{BMS} + Vf_{off/on} + Vr_{off/on} & \text{if one relay is open} \\ V_{BMS} + Vf_{on} + Vr_{on} & \text{if two relays are closed} \end{cases} \quad \text{Equation 3}$$

In some embodiments, at S760, the processor 210 may apply logic according to a command from a processor of a vehicle based on the corrected battery voltage Vs. In one embodiment, the processor 210 may determine whether to control the relays 220 and 230 based on the corrected battery voltage Vs at S760.

According to the above-described embodiments, even if the forward voltage drop of the diode D1 and the voltage drop across the wire 23 occurs according to the states of the relays 220 and 230, the voltage of the battery 21 measured by the processor 210 can be corrected based on the forward voltage drop of the diode D1 and the voltage drop across the wire 23 so that the error between the voltages measured by the two processors 24 and 210 can be reduced. Accordingly, it is possible to prevent the two processors 24 and 210 to which the same logic is applied from performing different operations.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery apparatus comprising:
a battery pack; and
a battery management system connected to the battery pack,
wherein the battery management system includes:
a circuit configured to receive a voltage from a power supply and to manage the battery pack;
a diode configured to transfer the voltage from the power supply to the circuit;
one or more relays positioned between the power supply and the circuit, wherein a forward voltage drop across the diode varies according to a state of the one or more relays; and
a processor configured to:
control the state of the one or more relays;
determine the forward voltage drop across the diode based on the controlled state of the one or more relays;
measure the voltage from the power supply; and
correct the measured voltage based on a voltage drop in the circuit, wherein the voltage drop is based at least in part on the determined forward voltage drop across the diode.

2. The battery apparatus of claim 1, wherein the voltage drop in the circuit is at least in part across a wire connecting the power supply and the circuit.

3. The battery apparatus of claim 1, wherein the diode includes a cathode and an anode, wherein the anode is connected to a wire connecting the power supply and the circuit, and wherein the diode is configured to transfer the voltage from the power supply to the circuit through the cathode.

4. The battery apparatus of claim 1, wherein the voltage drop is further at least in part across the wire.

5. The battery apparatus of claim 1, wherein the processor is configured to determine control of the circuit based on the corrected voltage.

6. The battery apparatus of claim 1, wherein the processor is configured to communicate with an external apparatus processor connected to the battery apparatus, and to receive a command from the external apparatus processor to control the circuit.

7. A battery apparatus comprising:
a battery pack; and
a battery management system connected to the battery pack,
wherein the battery management system includes:
a circuit configured to receive a voltage from a power supply and to manage the battery pack; and
a processor configured to
measure the voltage from the power supply and to correct the measured voltage based on a voltage drop in the circuit,
wherein the circuit includes:
a heating resistor configured to heat the battery pack;
a first relay connected between a first terminal of the heating resistor and a positive terminal of the battery pack and configured to operate based on the voltage from the power supply; and
a second relay connected between a second terminal of the heating resistor and a negative terminal of the battery pack and configured to operate based on the voltage from the power supply,
wherein the processor is configured to control operations of the first relay and the second relay, and
wherein the processor is configured to correct the measured voltage based further on a correction value that varies depending on states of the first relay and the second relay.

8. The battery apparatus of claim 7, wherein the correction value of a state in which the first relay and the second relay are closed is greater than the correction value of a state in which only one of the first relay and the second relay is closed, and
wherein the correction value of a state in which only one of the first relay and the second relay is closed is greater than the correction value of a state in which the first relay and the second relay are open.

9. The battery apparatus of claim 7, wherein the processor is configured to correct the measured voltage by adding the correction value to the measured voltage.

10. The battery apparatus of claim 7, wherein the first relay includes a first switch connected between the first terminal of the heating resistor and the positive terminal of the battery pack and a first relay coil configured to drive the first switch,
wherein the second relay includes a second switch connected between the second terminal of the heating resistor and the negative terminal of the battery pack and a second relay coil configured to drive the second switch,
wherein the circuit further includes a first driver connected to the first relay coil and a second driver connected to the second relay coil, and
wherein the processor is configured to control the first driver to supply the voltage from the power supply to the first relay coil, and control the second driver to supply the voltage from the power supply to the second relay coil.

11. A method of measuring and correcting a voltage from a power supply to a circuit configured to manage a battery pack, the method comprising:
controlling, by a processor, a state of one or more relays;
determining, by the processor, forward voltage drop across a diode configured to transfer the voltage from the power supply to the circuit, wherein the forward voltage drop is determined based on the controlled state of the one or more relays;
measuring, by the processor, the voltage of the power supply;
determining, by the processor, a correction value based on the determined forward voltage drop across the diode; and
correcting, by the processor, the measured voltage based on the correction value.

12. The method of claim 11, further comprising determining, by the processor, control of the circuit based on the corrected voltage.

13. The method of claim 11, wherein the correction value is based further on a voltage drop across a wire connecting the power supply and the circuit.

14. The method of claim 11, wherein the diode includes an anode and a cathode and connected to the power supply and is configured to transfer the voltage from the power supply to the circuit through the cathode.

15. A battery management system connected to a battery pack, comprising:
 a circuit configured to receive a voltage from a power supply and to manage the battery pack; and
 a processor configured to control a state of one or more relays, measure the voltage from the power supply, determine a forward voltage drop across a diode between the power supply and the circuit based on the controlled state of the one or more relays, and correct the measured voltage based on the forward voltage drop.

16. The battery management system of claim 15, wherein the diode includes a cathode and an anode, wherein the anode is connected to a wire connecting the power supply and the circuit and wherein the diode is configured to transfer the voltage from the power supply to the circuit through the cathode.

17. The battery management system of claim 15, wherein the measured voltage is based further on a voltage drop across a wire connecting the power supply and the circuit.

18. The battery management system of claim 15, wherein the one or more relays includes a plurality of relays, and
 wherein the processor is configured to correct the measured voltage based further on a correction value, wherein the correction value varies depending on states of the plurality of relays.

* * * * *